(12) United States Patent
Long et al.

(10) Patent No.: US 10,747,701 B2
(45) Date of Patent: Aug. 18, 2020

(54) RACKMOUNT SWITCH DEVICES FOR PERIPHERAL COMPONENT INTERCONNECT EXPRESS (PCIE) SYSTEMS

(71) Applicant: Liqid Inc., Broomfield, CO (US)

(72) Inventors: Christopher R. Long, Colorado Springs, CO (US); Jason Breakstone, Broomfield, CO (US); Andrew Rudolph Heyd, Longmont, CO (US); Brenden Michael Rust, Loveland, CO (US); Seth Walsh, Superior, CO (US); Bryan Schramm, Broomfield, CO (US)

(73) Assignee: Liqid Inc., Broomfield, CO (US)

(*) Notice: Subject to any disclaimer, the term of this patent is extended or adjusted under 35 U.S.C. 154(b) by 233 days.

(21) Appl. No.: 15/914,081

(22) Filed: Mar. 7, 2018

(65) Prior Publication Data
US 2018/0260352 A1    Sep. 13, 2018

Related U.S. Application Data

(60) Provisional application No. 62/490,986, filed on Apr. 27, 2017, provisional application No. 62/468,222, filed on Mar. 7, 2017.

(51) Int. Cl.
*G06F 1/20* (2006.01)
*G06F 13/40* (2006.01)
(Continued)

(52) U.S. Cl.
CPC ......... *G06F 13/4022* (2013.01); *G06F 1/188* (2013.01); *G06F 1/206* (2013.01);
(Continued)

(58) Field of Classification Search
CPC .......... H05K 7/20718; H05K 7/20727; H05K 7/20736; G06F 1/20; G06F 1/203; G06F 1/206; H01L 23/467
See application file for complete search history.

(56) References Cited

U.S. PATENT DOCUMENTS

| | | | |
|---|---|---|---|
| 9,904,336 B1* | 2/2018 | Khan | G06F 1/206 |
| 2002/0124114 A1* | 9/2002 | Bottom | H04L 49/351 709/251 |
| 2007/0026788 A1* | 2/2007 | Ballard | G11B 33/12 454/184 |
| 2007/0230113 A1* | 10/2007 | Chiang | G06F 1/181 361/679.47 |

(Continued)

OTHER PUBLICATIONS

International Application No. PCT/US2018/021271, International Search Report & Written Opinion, 10 pages, dated May 7, 2018.

*Primary Examiner* — Joseph O Schell

(57) ABSTRACT

Rackmount Peripheral Component Interconnect Express (PCIe) switch assemblies are provided herein. One example PCIe switch assembly includes an enclosure that encases elements of the PCIe switch assembly, a first plurality of PCIe interconnect ports positioned on a front side of the PCIe switch assembly, and a second plurality of PCIe interconnect ports positioned on a rear side of the PCIe switch assembly. One or more redundancy cross-link ports are provided to handle failover traffic with at least another PCIe switch assembly. PCIe switch circuitry is communicatively coupled to the first plurality of PCIe interconnect ports and the second plurality of PCIe interconnect ports that form a cluster interconnect PCIe fabric. A control processor is configured to control operation of at least the PCIe switch circuitry and the one or more redundancy cross-link ports.

19 Claims, 9 Drawing Sheets

(51) Int. Cl.
  *G06F 11/20* (2006.01)
  *G06F 13/42* (2006.01)
  *G06F 1/26* (2006.01)
  *G06F 11/30* (2006.01)
  *G06F 1/18* (2006.01)
  *H05K 7/20* (2006.01)
  *H01L 23/367* (2006.01)

(52) U.S. Cl.
  CPC .......... *G06F 1/266* (2013.01); *G06F 11/2007* (2013.01); *G06F 11/3006* (2013.01); *G06F 11/3058* (2013.01); *G06F 11/3062* (2013.01); *G06F 13/4282* (2013.01); *G06F 13/4295* (2013.01); *G06F 1/20* (2013.01); *G06F 11/3055* (2013.01); *G06F 2201/805* (2013.01); *G06F 2213/0026* (2013.01); *H01L 23/367* (2013.01); *H05K 7/20727* (2013.01)

(56) References Cited

U.S. PATENT DOCUMENTS

| | | | |
|---|---|---|---|
| 2008/0239945 A1 | 10/2008 | Gregg | |
| 2010/0110632 A1* | 5/2010 | Rose | H05K 7/20727 361/695 |
| 2012/0194350 A1* | 8/2012 | Crisp | G06F 1/26 340/815.42 |
| 2013/0339587 A1* | 12/2013 | Asnaashari | G06F 12/0246 711/103 |
| 2014/0351654 A1* | 11/2014 | Zhang | G06F 11/2221 714/43 |
| 2015/0127875 A1 | 5/2015 | Thomas | |
| 2015/0261710 A1* | 9/2015 | Billi | G06F 13/4022 710/316 |
| 2015/0370666 A1* | 12/2015 | Breakstone | G06F 11/2046 714/6.3 |

* cited by examiner

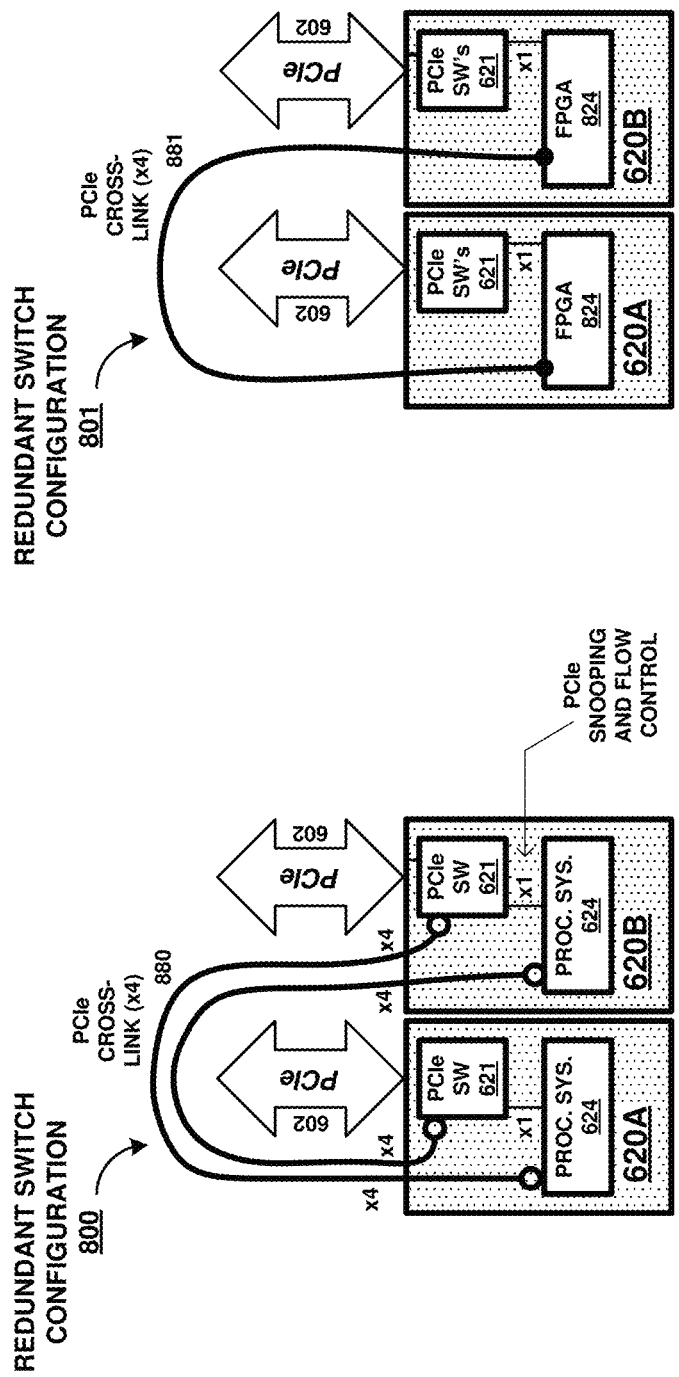

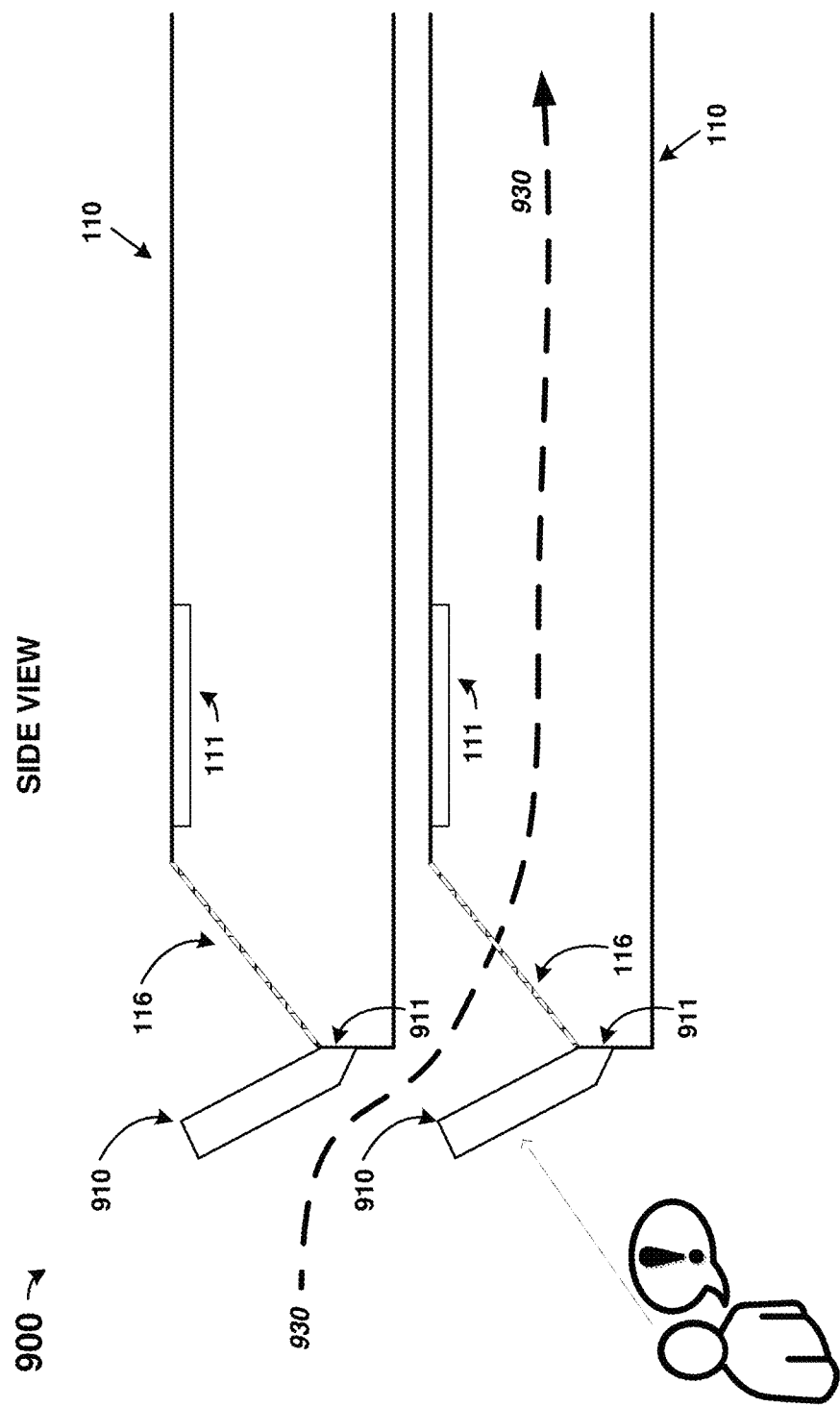

RACKMOUNT SWITCH DEVICES FOR PERIPHERAL COMPONENT INTERCONNECT EXPRESS (PCIE) SYSTEMS

RELATED APPLICATIONS

This application hereby claims the benefit of and priority to U.S. Provisional Patent Application 62/468,222, titled "RACKMOUNT SWITCH DEVICES FOR PERIPHERAL COMPONENT INTERCONNECT EXPRESS (PCIe) SYSTEMS," filed Mar. 7, 2017, which is hereby incorporated by reference in its entirety. This application also hereby claims the benefit of and priority to U.S. Provisional Patent Application 62/490,986, titled "REDUNDANCY AMONG RACKMOUNT SWITCH DEVICES FOR PERIPHERAL COMPONENT INTERCONNECT EXPRESS (PCIe) SYSTEMS," filed Apr. 27, 2017, which is hereby incorporated by reference in its entirety.

BACKGROUND

Networked storage and computing systems have been introduced which store and process large amounts of data in enterprise-class storage environments. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments. Some computing devices employ Peripheral Component Interconnect Express (PCIe) interfaces to connect to peripherals and storage devices. However, typical PCIe implementations employ point-to-point host-device architectures.

Overview

Rackmount Peripheral Component Interconnect Express (PCIe) switch assemblies are provided herein. One example PCIe switch assembly includes an enclosure that encases elements of the PCIe switch assembly, a first plurality of PCIe interconnect ports positioned on a front side of the PCIe switch assembly, and a second plurality of PCIe interconnect ports positioned on a rear side of the PCIe switch assembly. One or more redundancy cross-link ports are provided to handle failover traffic with at least another PCIe switch assembly. PCIe switch circuitry is communicatively coupled to the first plurality of PCIe interconnect ports and the second plurality of PCIe interconnect ports that form a cluster interconnect PCIe fabric. A control processor is configured to control operation of at least the PCIe switch circuitry and the one or more redundancy cross-link ports.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIG. 8A illustrates an example PCIe switch control in an implementation.

FIG. 8B illustrates an example PCIe switch control in an implementation.

FIG. 9 illustrates an example PCIe switch displays in an implementation.

DETAILED DESCRIPTION

The examples herein illustrate various Peripheral Component Interconnect Express (PCIe) switch device implementations. PCIe switch devices can provide for a switched fabric among various PCIe hosts and endpoints. A plurality of PCIe compatible ports can be provided to interconnect other devices in a rackmount environment using associated PCIe links. FIGS. 1-5 illustrate a rackmount PCIe switch assembly with 16 front-side and 8 rear-side PCIe ports, for a total of 24 PCIe ports. When coupled via associated cabling, the PCIe ports interconnect PCIe elements of a PCIe fabric comprising other systems not shown in FIG. 1.

Figure 1:
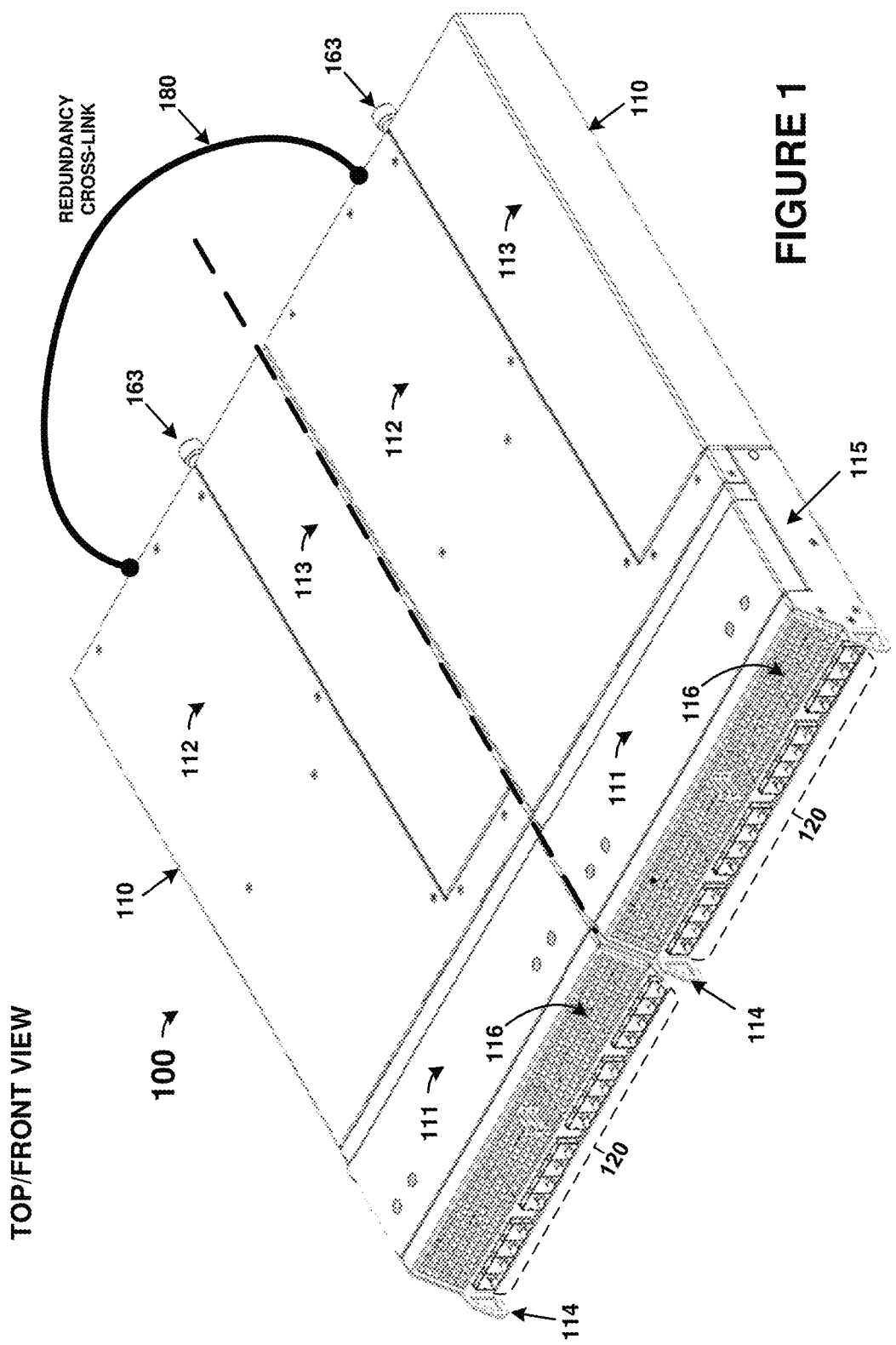
FIG. 1 illustrates example PCIe switch device implementations.

In FIG. 1, two switch assemblies 110 are shown in view 100 illustrating a top/front isometric view. Switch assembly 110 comprises structural elements to house and structurally support the elements of switch assembly 110. Enclosure 115 can include chassis elements, frames, fastening elements, rackmount features, ventilation features, among other elements. Enclosure 115 can be sized according to a multiple of a standardized computer rack height, such as 1U or 2U. Enclosure 115 of assembly 110 includes various chassis elements comprising top covers 111, 112, and 113. Cover 111 comprises a removable or top cover positioned over internal fans of assembly 110. Cover 111 can be opened to provide service access to fans within the enclosure. In many examples, enclosure 115 also includes fans or other cooling and ventilation elements for providing airflow to the elements of switch assembly 110. Enclosure 115 can also include power supply elements to convert external power sources or provide various forms of electrical power to the elements of switch assembly 110.

A detailed view 101 shows a front side of assembly 110. The front side of assembly 110 includes a first plurality of PCIe ports 120 positioned below ventilation feature 116 for internal fans of assembly 110. In FIG. 1, four groups of four PCIe ports are shown, comprising 16 front-side PCIe ports. In this example, the PCIe ports comprise mini-Serial Attached SCSI (SAS) HD connectors, Quad Small Form Factor Pluggable (QSFFP) jacks, QSFP/QSFP+ jacks, or zSFP+ interconnect, although other ports/jacks are possible.

PCIe ports 120 are grouped into sets of four (4) ports in the examples herein. With a front side of each switch assembly having a 4×4 port configuration and the rear side having a 2×4 port configuration to allow connections to other switches, devices, or servers with up to a ×16 bus, as well as supporting ×4 and ×8 bus widths, among others. Each PCIe port 120 can also have bottom mounted indicators (such as light-emitting diodes (LEDs)) that shine through associated PCIe port connectors to help guide customers in connecting cables, troubleshooting, and indicating connectivity and errors.

Covers 111-113, handles 114, enclosure 115, and ventilation features 116 each can comprise various materials such as metals, alloys, polymers, carbon composites, or other materials. In some examples, covers 111-113, handles 114, enclosure 115, and ventilation features 116 each comprise aluminum materials. Handles 114 are included on each end of the front side of assembly 110 to aid in insertion and removal of assembly 110 into a rackmount system. In some examples, handles 114 are coupled to latch mechanisms. When handles 114 are pulled by a user, the latch mechanisms retract a latch feature coupled by the latch mechanism to the associated handle. The latch features each hold an associated switch assembly 110 into a case or rackmount system.

Also seen in FIG. 1 is a redundancy cross-link 180 comprising at least one ×4 PCIe link that couples management controllers of two switch assemblies 110 together for failover among switch assemblies. In the event that a first switch assembly experiences a failure, control/management of the failed switch assembly can be taken over by a neighboring switch assembly coupled over link 180. Link 180 is coupled by one or more redundancy cross-link ports 211 on switch assembly 110 that are configured to handle failover traffic with at least another PCIe switch assembly. Redundancy cross-link port 211 via link 180 can allow a first PCIe switch assembly to control operation of one or more other PCIe switch assemblies, such as by sharing a single management processor across multiple PCIe switch assemblies and multiple PCIe switch circuitry instances. In this example, link 180 can couple using ports that comprise mini-Serial Attached SCSI (SAS) HD connectors, Quad Small Form Factor Pluggable (QSFFP) jacks, QSFP/QSFP+ jacks, or zSFP+ interconnect, although other ports/jacks are possible.

Figure 2:
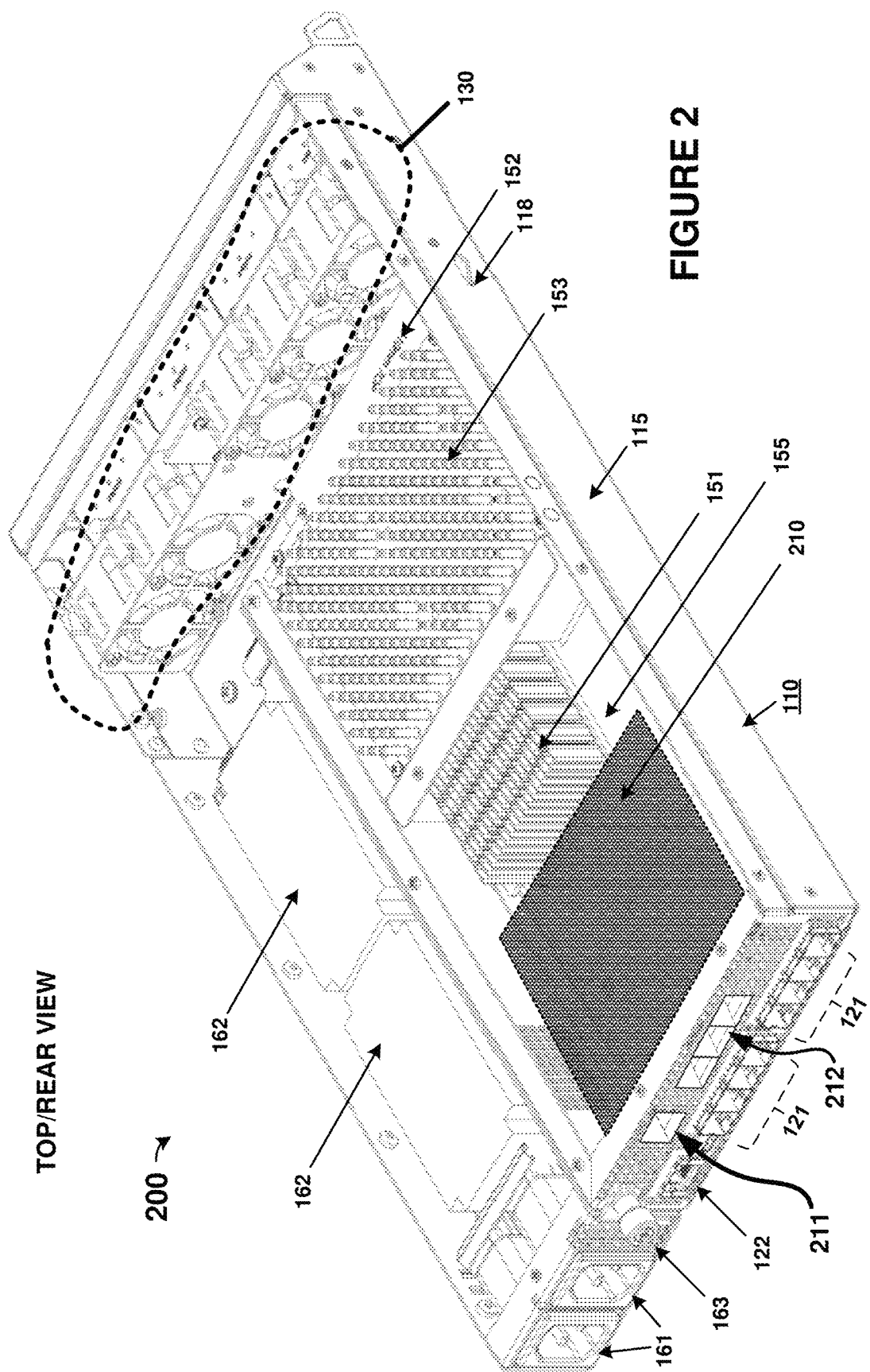
FIG. 2 illustrates example PCIe switch device implementations.

In FIG. 2, switch assembly 110 is shown in view 200. Similar elements as in FIG. 1 are seen in FIG. 2. Further electrical components can be included but are omitted in FIG. 2 for clarity. View 200 illustrates a top/front isometric view with covers removed to expose the service aperture for fan assembly 130 within enclosure 115 as well as expose the other internal components. FIG. 2 also shows latch 118 which can hold an associated switch assembly 110 into a case or rackmount system. Latch 118 can be coupled to handle 114 and a latch mechanism, as mentioned above.

Fan assembly 130 can include a plurality of fan units that can be removable for servicing, cleaning, and replacement. Cover latches can be included to hold cover 111 closed until an operator opens cover 111. Spring loaded or friction-fit latches can be employed, among other latch types, including magnetic fasteners.

In FIG. 2, fan assembly 130 includes rotating fan elements which are employed to move air within enclosure 115. These rotating fan elements can include one or more fins that are coupled to a central axis or shaft which rotates responsive to an electric motor or electric drive. Fan assembly 130 can each comprise any fan type, such as axial-flow, centrifugal and cross-flow, or other fan types, including associated ducts, louvers, fins, or other directional elements. Control of fan assembly 130 can include proportional control features, such as proportional-integral-derivative (PID) control for acoustic noise minimization.

Removal of fan cover 111 is monitored by control circuitry of switch assembly 110. Once removal is detected, such as via a sensing switch or other sensing circuit, the control circuitry can trigger one or more service events for switch assembly 110. For example, if fan assembly 130 is removed from main assembly after cover 111 is opened, then the control circuitry can: (1) start a timer, (2) increase a temperature polling frequency for temperature sensors within switch assembly 110, (3) responsive to a time or temperature threshold—alert a user of imminent power-down of switch assembly 110, and (4) power down switch assembly 110 for safety to protect internal components from heat damage.

Power supply assembly 160 includes input power ports 161 and mounting feature 163 which holds power supply assembly 160 into enclosure 115. Power supply assembly 160 is removable from enclosure 115 by loosening mounting feature 163. Two power supplies 162 are included in a redundant or parallel configuration to provide power to internal components of assembly 110. Each of input power ports can provide input power to an associated one of power supplies 162.

Circuit board 155 is employed to carry one or more of the circuitry elements of assembly 110. Circuit board 155 comprises an assembly of various circuitry, connectors, materials, interconnect, coatings, markings, fastener features, and other elements. Typically, circuit board 155 comprises an individual printed circuit board as a base onto which various components are mounted and into which electrical or optical interconnect is formed. Circuit board 155 can be fastened to chassis 115 for structural support and vibration resiliency. Circuit board 155 includes various external connectors, such as PCIe ports and Ethernet ports.

Circuit board 155 is configured to carry power and signals between the components of assembly 110. The signaling comprises PCIe signaling, sideband signaling, control signaling, discrete signaling, digital signaling, or analog signaling, among other signaling. Typically, input power is provided from a power source via input power ports 161 to power supplies 162. Power control circuitry of power supplies 162 is included that filters, conditions, converts, and distributes the input power to the various components of circuit board 155 via signaling associated with circuit board 155. Various voltages can be employed and converted among by the power supplies or on circuit board 155. Circuit board 155 can include further power control circuitry.

In FIG. 2, control processor 151 is included along with one or more PCIe switch circuits that are included underneath heatsink 153. Optional data storage devices 152 can be included to support operations of control processor 151. Control processor 151 can comprise a modular CPU assembly that couples to circuit board 155 via one or more connectors. Moreover, circuit board 155 can also include various microcontrollers (µC), field programmable gate arrays (FPGAs), or other processing and logic circuitry in addition to control processor 151.

FIG. 2 also includes a mezzanine circuit board 210. Mezzanine circuit board 210 couples via one or more connectors to circuit board 155. Mezzanine circuit board 210 includes further external ports for switch assembly 110, namely ports 211 and 212. Port 211 comprises a redundancy cross-link port that supports link 180 in FIG. 1 for failover among switch assemblies. Ports 212 comprise control plane interconnect, such as 10-Gigabit Ethernet ports (10 GbE). Ports 212 can comprise small form-factor pluggable plus (SFP+) or gigabit interface converter (GBIC) ports, 10 GbE, among others. Mezzanine board 210 can be swappable to support various port configurations, such as a first mezzanine configuration supporting SFP+ ports and a second mezzanine configuration supporting GBIC ports, among others. The control plane couples processing elements of switch assembly 110 to other control processors and PCIe fabric management processors. Below mezzanine ports is management port 122. Management port 122 comprises a local Ethernet port that is firewalled from other portions of switch assembly 110, and can be coupled to a system administrator device or tool over an Ethernet cable for in-box management functions and monitoring.

Figure 3:
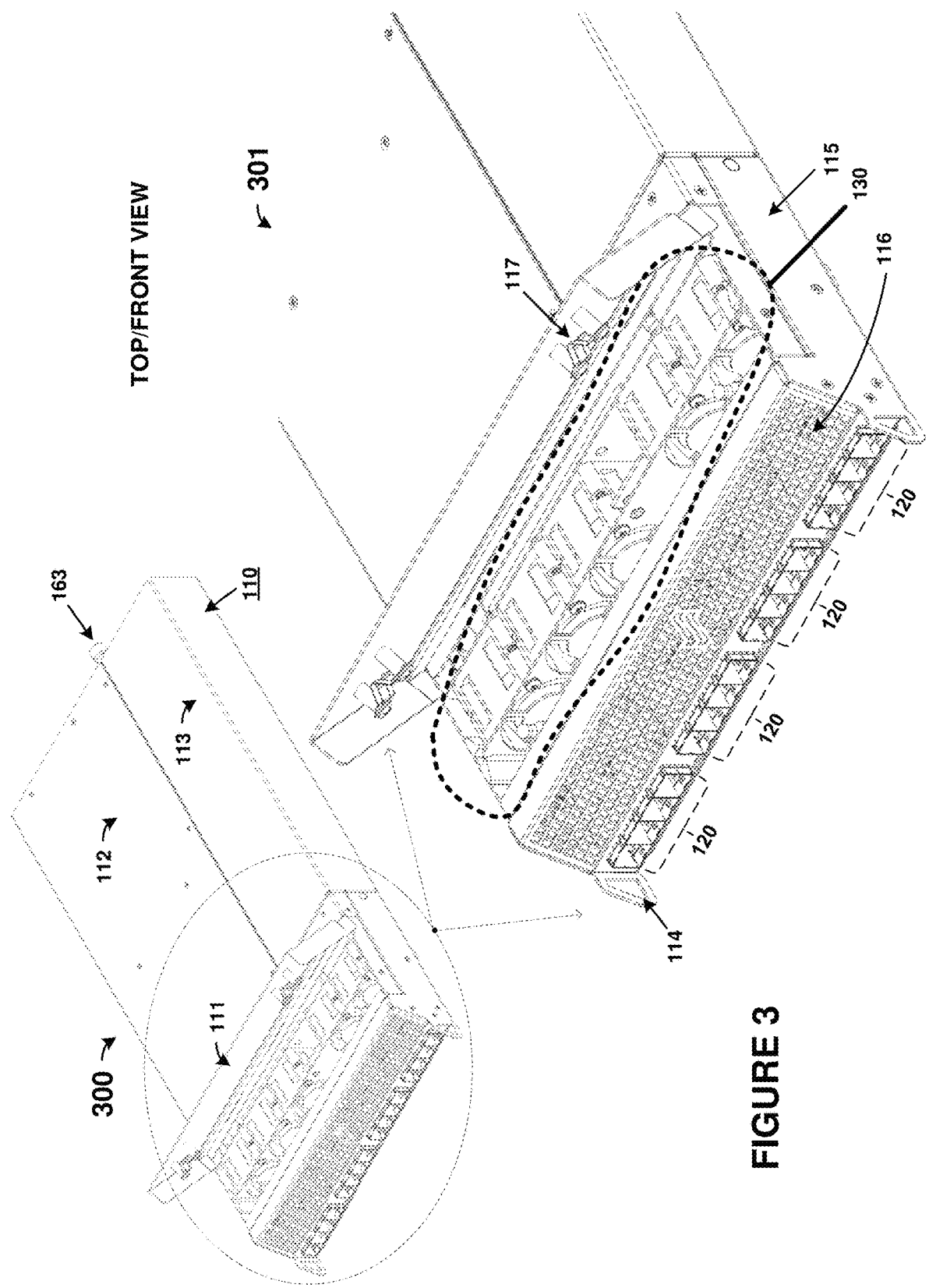
FIG. 3 illustrates example PCIe switch device implementations.

In FIG. 3, switch assembly 110 is shown in view 300. Similar elements as in FIG. 1-2 are seen in FIG. 3. Detailed view 301 illustrates a top/front isometric view with cover 111 tiled upwards to expose the service aperture for fan assembly 130 within enclosure 115. Fan assembly 130 can include a plurality of fan units that can be removable for servicing, cleaning, and replacement. Cover latches 117 can be included to hold cover 111 closed until an operator opens cover 111. Spring loaded or friction-fit latches can be employed, among other latch types.

Figure 4:
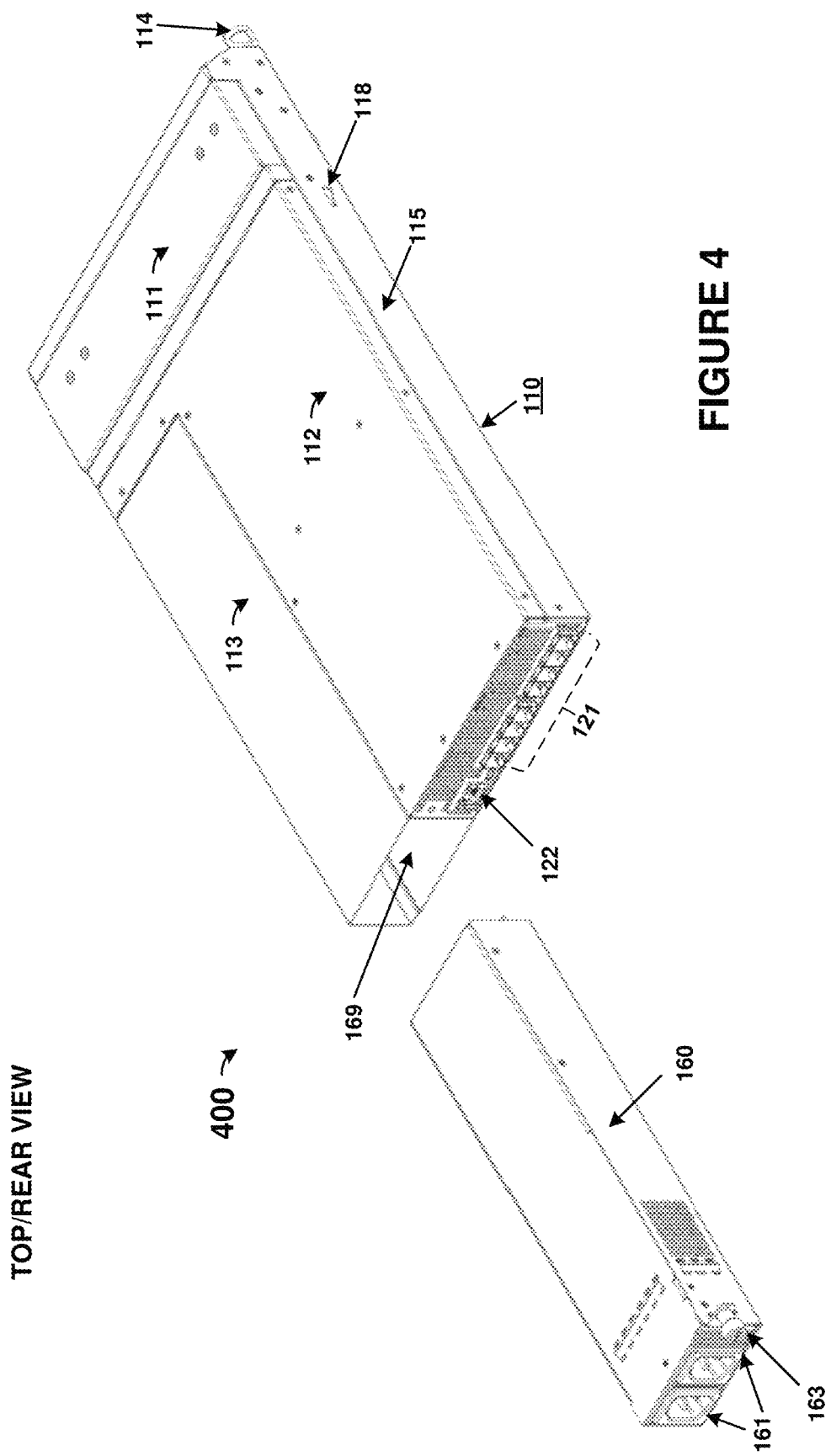
FIG. 4 illustrates example PCIe switch device implementations.

In FIG. 4, switch assembly 110 is shown in view 400. Similar elements as in FIG. 1-3 are seen in FIG. 4. View 400 illustrates a top/rear isometric view with power supply assembly 160 removed from enclosure 115. This removal can be performed for maintenance, replacement, or upgrade.

Figure 5:
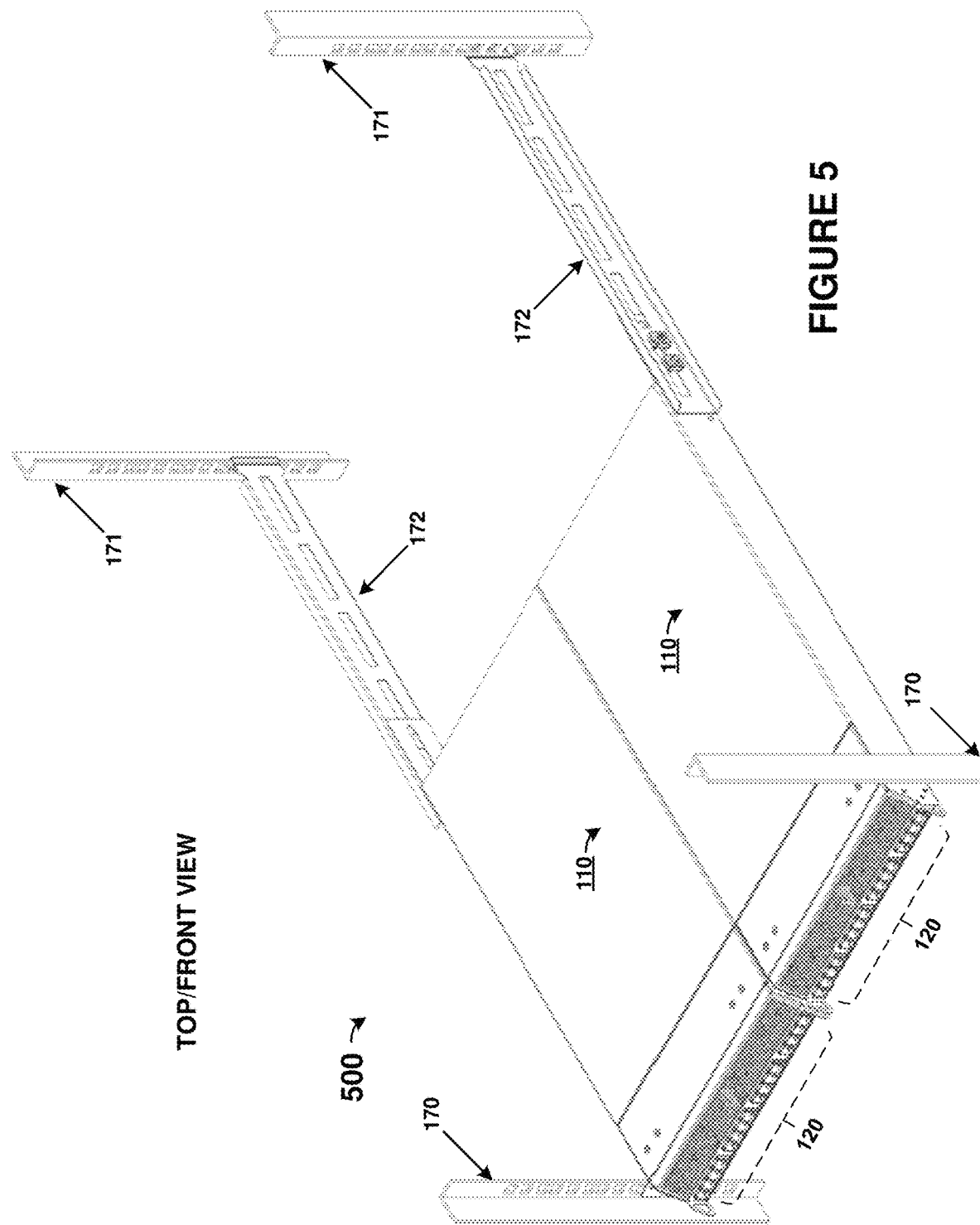
FIG. 5 illustrates example rack-mounted PCIe switch device implementations.

In FIG. 5, switch assembly 110 is shown in view 500. Similar elements as in FIG. 1-4 are seen in FIG. 5. View 500 illustrates a top/front isometric view of two switch assemblies mounted side-by-side via associated latches 118 and mounted into a rackmount system comprising front vertical members 170 and rear vertical members 171. Horizontal rails 172 are configured to support both switch assemblies within the rackmount assembly. In further examples, four switch assemblies 110 can be provided in a single 'layer' of 1 U rackmount space. Two front switch assemblies can be provided as seen in FIG. 5, with two further switch assemblies facing rearward.

Figure 6:
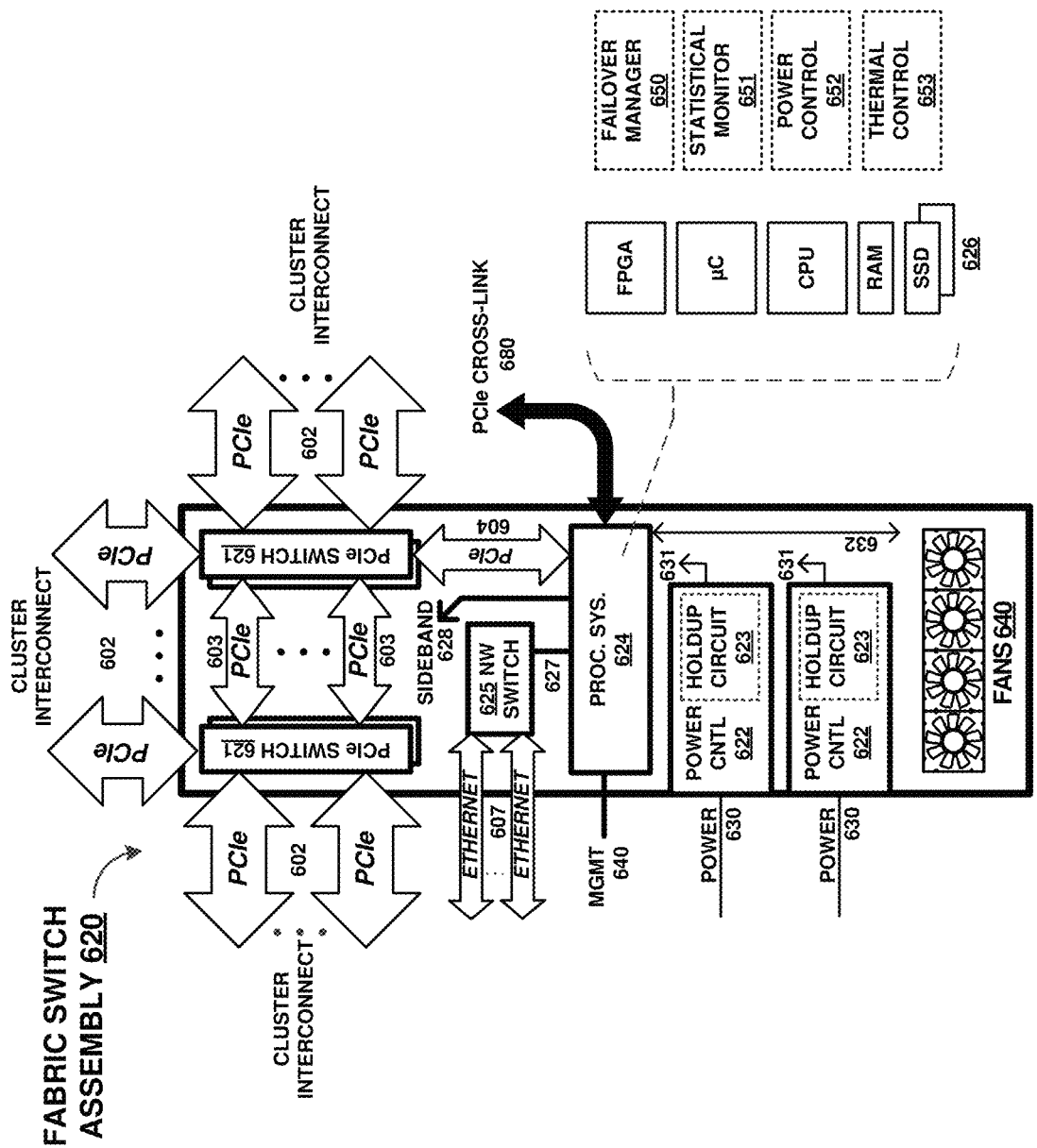
FIG. 6 illustrates example PCIe switch circuitry implementations.

FIG. 6 illustrates example implementations of internal electrical circuit components of assembly 110. FIG. 6 is a block diagram illustrating fabric switch assembly 620 as examples of circuitry and elements that comprise electrical and software elements of switch device 110. It should be understood that the elements of assembly 620 can be combined onto a single module, or included in separate modules.

Fabric switch assembly 620 includes one or more PCIe switches 621, one or more power control modules 622 with associated optional holdup circuits 623, control processing system 624, network switch 625, data storage 626, and ventilation fans 640. Fabric switch assembly 620 provides at least a portion of a Peripheral Component Interconnect Express (PCIe) fabric comprising PCIe links 602-604. PCIe links 602 provide external interconnect for devices of a computing/storage cluster, such as to interconnect various computing/storage rackmount modules. PCIe links 603-604 provide internal PCIe communication links for control processing system 624 as well as to interlink the one or more PCIe switches 621. Fabric switch assembly 620 also provides one or more Ethernet network links 607 via network switch 625. Various sideband or auxiliary links 628 can be employed as well in fabric switch assembly 620, such as System Management Bus (SMBus) links, Joint Test Action Group (JTAG) links, Inter-Integrated Circuit (I2C) links, Serial Peripheral Interfaces (SPI), controller area network (CAN) interfaces, universal asynchronous receiver/transmitter (UART) interfaces, universal serial bus (USB) interfaces, or any other communication interfaces. Further communication links can be included that are not shown in FIG. 6 for clarity.

Each of PCIe links 602-604 can comprise various widths or lanes of PCIe signaling. PCIe can support multiple bus widths, such as ×1, ×4, ×8, and ×16, among others, with each multiple of bus width comprising an additional "lane" for data transfer. PCIe also supports transfer of sideband signaling, such as SMBus and JTAG, as well as associated clocks, power, and bootstrapping, among other signaling. For example, each of links 602-604 can comprise PCIe links with four lanes "×4" PCIe links, PCIe links with eight lanes "×8" PCIe links, or PCIe links with 16 lanes "×16" PCIe links, among other lane widths.

One or more redundant and hot-swappable power control modules 622 can be included in fabric switch assembly 620, such as shown in FIGS. 2 and 4 for power supplies 162 and power supply module 160. These power control modules can be redundant to provide power to the elements of fabric switch assembly 620 during failure of one of the power control modules. Power control module 622 receives source input power over link 630 and converts/conditions the input power for use by the elements of fabric switch assembly 620. Power control module 622 distributes power to each element of fabric switch assembly 620 over associated power links 631. Power control module 622 can selectively enable/disable power for each element in assembly 620. Power control module 622 includes circuitry to selectively and individually provide power to any of the elements of fabric switch assembly 620. Power control module 622 can receive control instructions from control processing system 624 over an associated PCIe link or sideband link (not shown in FIG. 6 for clarity). In some examples, operations of power control module 622 is provided by processing elements discussed for control processing system 624.

Power control module 622 can include various power supply electronics, such as power regulators, step up converters, step down converters, buck-boost converters, power factor correction circuits, among other power electronics. Various magnetic, solid state, and other electronic components are typically sized according to the maximum power draw for a particular application, and these components are affixed to an associated circuit board.

Optionally, holdup circuitry can be employed. When employed, holdup circuit 623 includes energy storage devices for storing power received over power link 630 for use during power interruption events, such as loss of input power. Holdup circuit 623 can include capacitance storage devices, such as an array of capacitors, among other energy storage devices. Excess or remaining holdup power can be held for future use, bled off into dummy loads, or redistributed to other devices over PCIe power links or other power links.

Ventilation fans 640 each includes rotating fan or blower elements which are employed to move air within an associated enclosure. These rotating fan elements can include one or more fins that are coupled to a central axis or shaft which rotates responsive to an electric motor or electric drive. Ventilation fans 640 can each comprise any fan type, such as axial-flow, centrifugal and cross-flow, or other fan or blower types, including associated ducts, louvers, fins, or other air-directional elements. Thermal sensors or thermal measurement circuitry can be employed in fabric switch assembly 620 to monitor thermal status of the elements of fabric switch assembly 620. In FIG. 6, individual discrete temperature sensors can be distributed throughout fabric switch assembly 620, such as to measure temperatures or other thermal information related to fans 640, structural materials of an enclosure, ambient temperatures external to an enclosure, temperature inside of an enclosure, or of components of fabric switch assembly 620.

Network switch 625 can include one or more Ethernet switches to provide Ethernet links 607, including transceivers, transformers, isolation circuitry, buffers, and the like. Ethernet links 607 might comprise Gigabit Ethernet (1 GbE), 10 Gigabit Ethernet (10 GbE), 40 Gigabit Ethernet (40 GbE), or 100 Gigabit Ethernet (100 GbE), among other speeds and formats of network links. Network switch 625 can carry Ethernet traffic, along with any associated Internet protocol (IP) and transmission control protocol (TCP) traffic, among other network communication formats and protocols.

Control processing system 624 includes one or more microprocessors or microcontrollers along with any associated storage memory 626. Control processing system 624 can be an implementation of portions of control processor 151 in some examples. Control processing system 624 communicates over PCIe link 604 and Ethernet links 607, along with optional sideband communications 628, as mentioned above including USB links, I2C links, or serial links, among others.

Control processing system 624 can accumulate statistical data and usage information for a PCIe fabric switch assembly. External systems can retrieve this statistical data or usage information over Ethernet link 607 via network switch 625 or via cluster interconnect 602. Fabric switch assembly 620 also provides expansion of a control plane for cluster control plane interconnect over Ethernet link 607.

Control processing system 624 can be implemented within a single processing device but can also be distributed across multiple processing devices or sub-systems that cooperate in executing program instructions. Examples of control processing system 624 include general purpose central processing units, microprocessors, application specific processors, and logic devices, as well as any other type of processing device. Control processing system 624 can include one or more non-transitory memory devices 626, such as RAM, solid state storage devices (SSD), or other memory to store instructions that are executable by control processing system 624 to operate as discussed herein. Control processing system 624 can monitor usage statistics, traffic status, or other usage information of fabric switch assembly 620 through links 604 and 607. Control processing system 624 can track this usage information during normal operation and data transfer within fabric switch assembly 620. In some examples, memory devices 626 comprise one or more M.2 type solid state drive (SSD) memory devices.

Elements of memory devices 626 together can comprise a non-transitory data storage system, although variations are possible. Memory devices 626 can comprise any storage media readable by control processing system 624 and capable of storing software. Memory devices 626 can include volatile and nonvolatile, removable and non-removable media implemented in any method or technology for storage of information, such as computer readable instructions, data structures, program modules, or other data. Memory devices 626 can include non-volatile storage media, such as solid-state storage media, flash memory, phase change memory, or magnetic memory, including combinations thereof. Memory devices 626 can be implemented as a single storage device but can also be implemented across multiple storage devices or sub-systems.

Memory devices 626 can comprise additional elements, such as controllers, capable of communicating with control processing system 624.

Software stored on or in memory devices 626 can comprise computer program instructions, firmware, or some other form of machine-readable processing instructions having processes that when executed a processing system direct control processing system 624 to operate as described herein. For example, software drives control processing system 624 to control failover processes of PCIe switches and power modules, monitor operating statistics and status for a storage device, monitor power status, and instruct power circuitry 622 to control flow of optional holdup power or operational power, among other operations. The software can also include user software applications. The software can be implemented as a single application or as multiple applications. In general, the software can, when loaded into a processing system and executed, transform the processing system from a general-purpose device into a special-purpose device customized as described herein.

Software modules 650-653 each comprise executable instructions which can be executed by control processing system 624 or power control module 622 for operating elements of fabric switch assembly 620 according to the processes discussed herein. Specifically, failover manager 650 monitors operational status for at least PCIe switches 621 to determine when one or more of the PCIe switches or associated links experiences errors, failures, or other issues. Failover manager 650 can control failover of traffic handled by first PCIe switches to second PCIe switches, such as controlling traffic partitioning, logical partitioning, non-transparent port configurations, logical domain configurations, or other configurations and partitioning among the PCIe switches. When redundant PCIe switches are employed, failover manager 650 can configure backup PCIe switches to handle traffic of otherwise non-functional primary PCIe switches, and ensure traffic handling can be maintained over the PCIe fabric and cluster interconnect.

Failover manager 650 restart individual PCIe switches by cycling power for the associated PCIe switches. In other examples, a reset command can be issued to the PCIe switches. In yet other examples, a PCIe command is issued to the affected PCIe switches which commands a reset of those particular PCIe switches. Failover manager 650 can read and store in SSD 626 configuration information comprising a configuration state or PCIe routing information for the affected PCIe switch and reconfigure that PCIe switch with the stored state or PCIe routing information once reset. The configuration state or PCIe routing information can include an identity of the PCIe switch, an address of the PCIe switch, a logical partitioning or non-transparent port configuration of the PCIe switch, among other status, configurations, and information.

During the restart process, any systems which are communicatively coupled via the affected PCIe switch can be shielded from a restart process using a redundant or backup PCIe switch so that the systems are not aware of the failure, problem, or associated restart. If the reset process fails to resolve the problem with the particular PCIe switch, then that PCIe switch can be powered down. Remaining PCIe switches can continue to operate over associated PCIe interfaces during the reset/power cycle process for an affected PCIe switch, and when any particular PCIe switch fails. Thus, enhanced operation can be achieved by having continued operation of a PCIe fabric during individual PCIe switch failures, and those individual PCIe switch failures can be resolved by failover manager 650 without external/host system involvement or interruption by using the process described above.

Statistical monitor 651 monitors usage status or usage statistics for elements of fabric switch assembly 620. The usage statistics include data transfer rates of links, error rates of links, a cumulate number of errors of links, among other statistics. The usage statistics can be collected and stored by control processing system 624 in a data structure, such as a database or table and stored in memory devices 626 or other storage elements.

Power control 652 monitors power statistics during operational processes, power status statistics, power active status, voltage levels, phase measurements, current draw, holdup circuit status or levels, power module insertion status, thermal levels, among other statistics. Power control 652 instructs power circuitry to power up or power down an associated storage device or module responsive to statistical monitor 651, among other signals such as discrete signals monitored by power control module 622. Power control 652 can power up or power down elements of fabric switch assembly 620 responsive to operational status of associated PCIe switches, network switches, commands received over any of the PCIe, Ethernet, or sideband interfaces, or other factors.

Thermal control 653 controls operation of fans 640. Thermal control 653 can adjust fan speed and fan operation of fans 640 according to operational status, thermal status, temperature thresholds, or statistics of fabric switch assembly 620. During operation of fabric switch assembly 620, various temperature sensors can monitor enclosure temperatures of fabric switch assembly 620. Airflow provided by one or more of fans 640 can be adjusted to change an airflow state of an enclosure. For example, a current fan speed can be monitored along with the current temperature inside the enclosure, and fans 640 can be adjusted to adjust an airflow rate by changing a speed of rotation of fans 640. In examples where louvered or finned airflow apertures are employed, louvers or fins can be adjusted to change airflow. Thermal control 653 can adjust the fan speed, and can receive feedback from fans 640 or from other sensors to indicate a current fan speed and associated temperatures.

Software modules 650-653 can reside in a RAM portion of memory devices 626 during execution and operation by control processing system 624, and can reside in a non-volatile storage space of memory devices 626 during a powered-off state, among other locations and states. Software modules 650-653 can be loaded into RAM during a startup or boot procedure as described for computer operating systems and applications. Non-volatile storage portions of memory devices 626 can include one or more storage systems comprising flash memory such as NAND flash or NOR flash memory, phase change memory, magnetic memory, among other solid-state storage technologies.

Control processing system 624 is generally intended to represent a computing system where at least software modules 650-653 are deployed and executed in order to render or otherwise implement the operations described herein. However, control processing system 624 can also represent any computing system on which at least these software modules 650-653 can be staged and from where software modules 650-653 can be distributed, transported, downloaded, or otherwise provided to yet another computing system for deployment and execution, or yet additional distribution. It should be understood that one or more among software modules 650-653 can be stored, deployed, executed, and operated by any of control processing system 624 or processing elements of power control module 622.

Each PCIe switch 621 comprises one or more PCIe crosspoint switches, which logically interconnect various ones of the associated PCIe links based at least on the traffic carried by associated PCIe links. Each PCIe switch 621 establishes switched connections between any PCIe interfaces handled by each PCIe switch 621. In some examples, each PCIe switch 621 comprises PLX/Broadcom/Avago PEX8796 24-port, 96 lane PCIe switch chips, PEX8725 10-port, 24 lane PCIe switch chips, PEX97xx chips, PEX9797 chips, or other PEX87xx/PEX97xx chips. In some examples, redundancy is established via one or more PCIe switches 621, such as having primary and secondary/backup ones among the PCIe switches. Failover from primary PCIe switches to secondary/backup PCIe switches can be handled by at least control processing system 624. In some examples, primary and secondary functionality can be provided in different PCIe switches using redundant PCIe links to the different PCIe switches. In other examples, primary and secondary functionality can be provided in the same PCIe switch using redundant links to the same PCIe switch.

PCIe switches 621 each include cluster interconnect interfaces 602 which are employed to interconnect further modules of computing and storage systems in further enclosures. Cluster interconnect provides PCIe interconnect between external systems, such as computing and storage systems, over associated external connectors and external cabling. These connections can be PCIe links provided by any of the included PCIe switches, among other PCIe switches not shown, for interconnecting other modules of storage systems via PCIe links. The PCIe links used for cluster interconnect can terminate at external connectors or jacks, such as mini-Serial Attached SCSI (SAS) connectors HD, Quad Small Form Factor Pluggable (QSFFP), QSFP/QSFP+, or zSFP+ interconnect, which are employed to carry PCIe signaling over associated cabling, such as mini-SAS or QSFFP cabling. In further examples, MiniSAS HD cables are employed that drive 12 Gb/s versus 6 Gb/s of standard SAS cables. 12 Gb/s can support at least PCIe Generation 3.

PCIe links 602-604 can also carry NVMe (NVM Express) traffic issued by a host processor or host system. NVMe (NVM Express) is an interface standard for mass storage devices, such as hard disk drives and solid state memory devices. NVMe can supplant serial ATA (SATA) interfaces for interfacing with mass storage devices in personal computers and server environments. However, these NVMe interfaces are limited to one-to-one host-drive relationship, similar to SATA devices. In the examples discussed herein, a PCIe interface can be employed to transport NVMe traffic and present a multi-drive system comprising many storage drives as one or more NVMe virtual logical unit numbers (VLUNs) over a PCIe interface.

Figure 7:
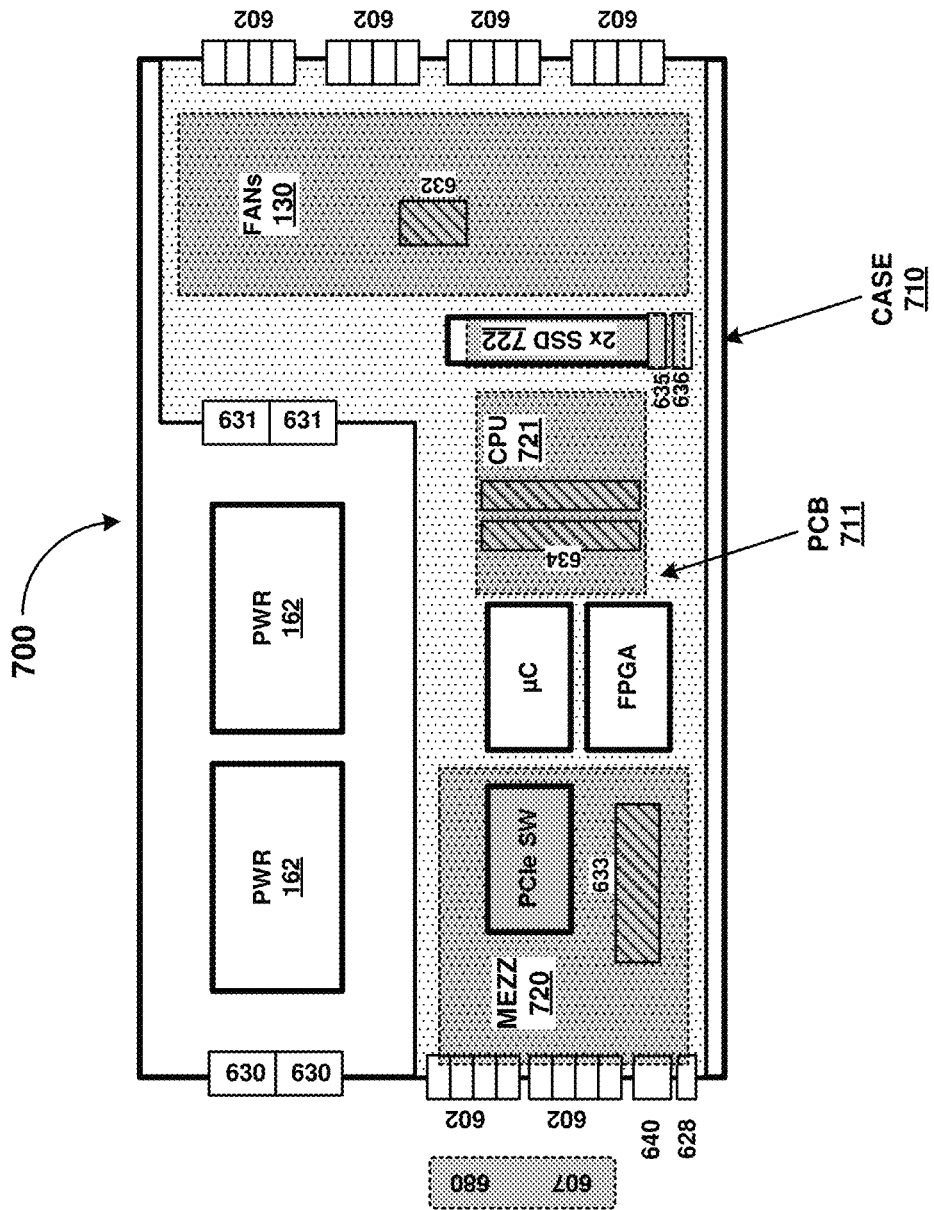
FIG. 7 illustrates example PCIe switch circuitry implementations.

FIG. 7 illustrates example implementations of internal electrical components of switch assembly 110. FIG. 7 is a block diagram illustrating switch assembly 700. Switch assembly 700 includes a case or enclosure 710 as well as main printed circuit board (PCB) 711. Various daughter modules are also included and are coupled to circuit board 711 via one or more individual connectors 633-636. These daughter modules include mezzanine circuit board 720, compute module (CPU) 721, and two vertically stacked M.2 SSDs 722. Removable power supply modules 162 are included as well as fan assembly/module 130. Power supply modules 162 receive input power via external connectors 630 and supply converted internal power via internal connectors 631. Fan module 130 couples to circuit board 711 via connector 632 which supplies power and control signaling.

Mezzanine circuit board 720 can include elements discussed above for mezzanine circuit board 210 in FIG. 2. Mezzanine circuit board 720 includes further external ports for switch assembly 700, namely ports 607 and 680. Port 680 comprises a redundancy cross-link port that supports link 180 in FIG. 1 for failover among switch assemblies. Ports 607 comprise control plane interconnect, such as 10-Gigabit Ethernet ports (10 GbE). Ports 607 can comprise small form-factor pluggable plus (SFP+) or gigabit interface converter (GBIC) ports, 10 GbE, among others. Mezzanine board 720 can be swappable to support various port configurations, such as a first mezzanine configuration supporting SFP+ ports and a second mezzanine configuration supporting GBIC ports, among others. The control plane couples processing elements of switch assembly 700 to other control processors and PCIe fabric management processors. Below the mezzanine ports are management port 640, universal serial bus (USB) type-C connector 628, and PCIe ports 602.

FIGS. 8A and 8B illustrate example implementations of internal electrical components of switch assembly 110. FIG. 8A is a block diagram illustrating switch assembly configuration 800. FIG. 8B is a block diagram illustrating switch assembly configuration 801.

In configuration 800, two switch assemblies 620A-620B are presented in a redundant configuration using processing systems 624, which might comprise a CPU or other microprocessor. A ×1 PCIe interface is coupled between each processing system 624 and PCIe switch 621 for PCIe traffic snooping, switch management, and switch/traffic flow control. Two ×4 PCIe redundancy links are included as PCIe cross-link 880. If a processing system 624 of one of the switch assemblies fails, then a processing system of another switch assembly can act as a failover processor to control operations of at least PCIe switch 621 in the failed switch assembly.

In configuration 801, two switch assemblies 620A-620B are presented in a redundant configuration using FPGAs 824, which might comprise a programmable logic or discrete logic with an embedded microprocessor or microcontroller. A ×1 PCIe interface is coupled between each FPGA 824 and PCIe switch 621 for PCIe traffic snooping, switch management, and switch/traffic flow control. One ×4 PCIe redundancy link is included as PCIe cross-link 881, which is directly coupling FPGAs 824 instead of the crossover configuration of FIG. 8A. If a FPGA 824 of one of the switch assemblies fails, then a FPGA 824 of another switch assembly can act as a failover processor to control operations of at least PCIe switch 621 in the failed switch assembly.

In FIG. 9, two stacked switch assemblies 110 are shown in view 900. Similar elements as in FIGS. 1-2 are seen in FIG. 9. FIG. 9 is provided to emphasize airflow into each switch assembly. In some examples the upper/top switch assembly is omitted or another upper module is include that does not comprise switch assembly 110. When stacked or otherwise obstructed by a module above a lower switch assembly 110, airflow 930 is still provided for internal fan assembly elements located under fan cover 111. This is provided in part by the angled front face ventilation features 116.

Also seen in FIG. 9 is user display 910. User display 910 can optionally attach to a front face of each switch assembly 110 and provide various visual or graphical information to users, such as via alerts, sounds, graphical user interfaces, or other interfaces. User display 910 can attach using various fasteners, latches, or other mechanisms. In some examples, user display 910 couples via magnetic fasteners and allows for easy removal of user display 910 from switch assembly 110 for user inspection, user handling, or quick/easy removal/replacement.

In yet further examples, user display 910 comprises an organic light-emitting diode (OLED) array or display screen that can display any number of graphical user interface elements. The display can include indicators positioned proximate to ports on the front face of switch assembly 110 that can show status, traffic indications, alerts, errors, or other information. Also, assembly-wide status, traffic indications, alerts, errors, or other information can be displayed. Various graphical icons or symbols can be employed to show a user the information. Also, near-field (e.g. NFC) or personal-area network (e.g. Bluetooth) transceivers can be included to allow a user to send/receive management information with portable user devices or to configure the display itself. Moreover, when user display 110 is removable for hand-held use by a user, a wireless link can be established that couples user display 110 to the management status or information of switch assembly 110.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A Peripheral Component Interconnect Express (PCIe) switch assembly, comprising:
    an enclosure that encases elements of the PCIe switch assembly;
    one or more removable fans positioned in the enclosure and proximate to a front side of the PCIe switch assembly that provide airflow to the elements of the PCI switch assembly;
    a first plurality of PCIe interconnect ports positioned on a front side of the PCIe switch assembly and below front ventilation features associated with the one or more removable fans;
    a second plurality of PCIe interconnect ports positioned on a rear side of the PCIe switch assembly and below rear ventilation features associated with the one or more removable fans;
    one or more redundancy cross-link ports configured to handle failover traffic with at least another PCIe switch assembly;
    PCIe switch circuitry communicatively coupled to the first plurality of PCIe interconnect ports and the second plurality of PCIe interconnect ports that form a cluster interconnect PCIe fabric; and
    a control processor configured to control operation of at least the one or more removable fans, the PCIe switch circuitry, and the one or more redundancy cross-link ports.

2. The PCIe switch assembly of claim 1, wherein the one or more redundancy cross-link ports comprise at least a first port configured to couple the control processor of the PCIe switch assembly to PCIe switch circuitry of the other PCIe switch assembly; and wherein the one or more redundancy cross-link ports further comprise at least a second port configured to couple the PCIe switch circuitry of the PCIe switch assembly to a control processor of the other PCIe switch assembly.

3. The PCIe switch assembly of claim 2, wherein responsive to failure of at least the control processor of the PCIe switch assembly, the control processor of the other PCIe switch assembly controls operation of at least the PCIe switch circuitry of the PCIe switch assembly via the one or more redundancy cross-link ports.

4. The PCIe switch assembly of claim 1, wherein the one or more redundancy cross-link ports comprise at least a first port configured to couple the control processor of the PCIe switch assembly to a control processor of the other PCIe switch assembly.

5. The PCIe switch assembly of claim 4, wherein responsive to failure of at least the control processor of the PCIe switch assembly, the control processor of the other PCIe switch assembly controls operation of at least the PCIe switch circuitry of the PCIe switch assembly via the one or more redundancy cross-link ports.

6. The PCIe switch assembly of claim 1, wherein the one or more redundancy cross-link ports comprise ×4 PCIe ports.

7. The PCIe switch assembly of claim 1, wherein the PCIe switch assembly and the other PCIe switch assembly fit side-by-side into a rackmount configuration.

8. The PCIe switch assembly of claim 1, further comprising:
a fan service cover coupled on a top side of the enclosure and configured to provide service access to the one or more removable fans via the top side of the enclosure.

9. The PCIe switch assembly of claim 1, further comprising:
a power supply assembly removeable from the rear side of the PCIe switch assembly and configured to provide power to at least the elements of the PCIe switch assembly.

10. The PCIe switch assembly of claim 1, comprising:
the control processor configured to monitor for a failure of one or more PCIe switch elements among the PCIe switch circuitry; and
responsive to the failure, the control processor configured to disable the one or more PCIe switch elements associated with the failure, and instruct at least a backup PCIe switch element among the PCIe switch circuitry to handle corresponding PCIe traffic instead of the one or more PCIe switch elements associated with the failure.

11. The PCIe switch assembly of claim 10, comprising:
the control processor configured to reset the one or more PCIe switch elements associated with the failure; and
responsive to determining that the one or more PCIe switch elements associated with the failure no longer experience the failure, the control processor configured to instruct the one or more PCIe switch elements associated with the failure to handle the corresponding PCIe traffic.

12. The PCIe switch assembly of claim 10, comprising:
the control processor configured to store configuration information for the one or more PCIe switch elements in a non-volatile memory device;
responsive to determining that the one or more PCIe switch elements associated with the failure no longer experience the failure, the control processor configured to retrieve the configuration information from the non-volatile memory device and instruct the one or more PCIe switch elements associated with the failure to handle the corresponding PCIe traffic based at least on the configuration information.

13. The PCIe switch assembly of claim 1, further comprising:
a display element positioned on the front side of the PCIe switch assembly and configured to display at least status of the PCIe switch assembly; and
a front portion of the enclosure configured to provide for airflow from a fan assembly of the PCIe switch assembly around the display element on the front side of the PCIe switch assembly.

14. A method of operating a Peripheral Component Interconnect Express (PCIe) switch assembly, the method comprising:
providing one or more removable fans positioned in an enclosure of the PCIe switch assembly proximate to a front side of the PCIe switch assembly that provide airflow to the elements of the PCI switch assembly;
forming a cluster interconnect PCIe fabric among at least a first plurality of PCIe interconnect ports, and a second plurality of PCIe interconnect ports, wherein the first plurality of PCIe interconnect ports are positioned on a front side of the PCIe switch assembly and below front ventilation features associated with the one or more removable fans, and the second plurality of PCIe interconnect ports are positioned on a rear side of the PCIe switch assembly and below rear ventilation features associated with the one or more removable fans;
providing one or more redundancy cross-link ports to handle failover traffic with at least another PCIe switch assembly; and
controlling, with a control processor, operations of at least the one or more removable fans, PCIe switch circuitry associated with the first plurality of PCIe interconnect ports and the second plurality of PCIe interconnect ports, and the one or more redundancy cross-link ports.

15. The method of claim 14, wherein the one or more redundancy cross-link ports comprise at least a first port configured to couple the control processor of the PCIe switch assembly to PCIe switch circuitry of the other PCIe switch assembly; and
wherein the one or more redundancy cross-link ports further comprise at least a second port configured to couple PCIe switch circuitry of the PCIe switch assembly to a control processor of the other PCIe switch assembly.

16. The method of claim 15, wherein responsive to failure of at least the control processor of the PCIe switch assembly, the control processor of the other PCIe switch assembly controls operation of at least the PCIe switch circuitry of the PCIe switch assembly via the second port.

17. The method of claim 14, wherein the one or more redundancy cross-link ports comprise at least a first port configured to couple the control processor of the PCIe switch assembly to a control processor of the other PCIe switch assembly, and wherein responsive to failure of at least the control processor of the PCIe switch assembly, the control processor of the other PCIe switch assembly controls operation of at least the PCIe switch circuitry of the PCIe switch assembly via the first port.

18. A rackmount Peripheral Component Interconnect Express (PCIe) switch assembly, comprising:
an enclosure that encases the elements of the PCIe switch assembly;

one or more removable fans positioned in the enclosure and proximate to a front side of the PCIe switch assembly that provide airflow to the elements of the PCI switch assembly;

a fan service cover configured to provide service access to the one or more removable fans via a top side of the enclosure of the PCIe switch assembly;

a first plurality of PCIe interconnect ports positioned on the front side of the PCIe switch assembly and below front ventilation features associated with the one or more removable fans;

a second plurality of PCIe interconnect ports positioned on a rear side of the PCIe switch assembly and below rear ventilation features associated with the one or more removable fans;

a power supply assembly removeable from a rear side of the PCIe switch assembly and configured to provide power to the elements of the PCIe switch assembly;

PCIe switch circuitry communicatively coupled to the first plurality of PCIe interconnect ports and the second plurality of PCIe interconnect ports that form a cluster interconnect PCIe fabric; and a control processor configured to control operation of at least the PCIe switch circuitry and the one or more removable fans.

19. The rackmount PCIe switch assembly of claim 18, further comprising:

one or more redundancy cross-link ports configured to handle failover traffic with at least another PCIe switch assembly; and the control processing system further configured to control operation of the one or more redundancy cross-link ports.

* * * * *